(12) United States Patent
Chau et al.

(10) Patent No.: US 10,768,064 B2
(45) Date of Patent: Sep. 8, 2020

(54) MEMS PRESSURE GAUGE SENSOR AND MANUFACTURING METHOD

(71) Applicant: INSTITUTE OF GEOLOGY AND GEOPHYSICS, CHINESE ACADEMY OF SCIENCES, Beijing (CN)

(72) Inventors: Kevin Chau, Beijing (CN); Man Wong, Hong Kong (CN)

(73) Assignee: CHINESE ACADEMY OF SCIENCES INSTITUTE OF GEOLOGY AND GEOPHYSICS, Beijing (CN)

( * ) Notice: Subject to any disclaimer, the term of this patent is extended or adjusted under 35 U.S.C. 154(b) by 71 days.

(21) Appl. No.: 15/753,131

(22) PCT Filed: Jul. 8, 2016

(86) PCT No.: PCT/CN2016/000369
§ 371 (c)(1),
(2) Date: Feb. 15, 2018

(87) PCT Pub. No.: WO2017/028465
PCT Pub. Date: Feb. 23, 2017

(65) Prior Publication Data
US 2018/0275000 A1    Sep. 27, 2018

(30) Foreign Application Priority Data

Aug. 17, 2015   (CN) .......................... 2015 1 0506032

(51) Int. Cl.
*G01L 9/00* (2006.01)
*G01L 9/04* (2006.01)
(Continued)

(52) U.S. Cl.
CPC .......... *G01L 9/0052* (2013.01); *B81B 3/0072* (2013.01); *B81B 7/0061* (2013.01);
(Continued)

(58) Field of Classification Search
CPC .... B81B 2201/0264; B81B 2203/0109; B81B 2203/0118; B81B 3/0072; B81B 7/0061;
(Continued)

(56) References Cited

U.S. PATENT DOCUMENTS

| 3,617,780 A | 11/1971 | Benjaminson |
| 5,024,098 A | 6/1991 | Petitjean et al. |

(Continued)

FOREIGN PATENT DOCUMENTS

| CN | 101419227 A | 4/2009 |
| CN | 103674355 A | 3/2014 |

(Continued)

OTHER PUBLICATIONS

Y. Kanda, "A Graphical Representation of the Piezoresistance Coefficients in Silicon." IEEE Transactions on Electron Devices, vol. ED-29, No. 1, pp. 64-70, Jan. 1982.
(Continued)

*Primary Examiner* — Francis C Gray
(74) *Attorney, Agent, or Firm* — Dergosits & Noah LLP

(57) ABSTRACT

The present invention relates to a MEMS pressure sensor die and its fabrication process. The pressure sensor comprises a chamber inside which a MEMS pressure sensor die is provided. The pressure sensor die comprises a handle, a device layer and a cap all connected together. A silicon oxide layer is formed between the handle and the device layer. Another silicon oxide layer is formed between the device layer and the cap. Recesses are respectively formed on the handle and the cap and face each other. The handle recess and the cap recess are connected to form a cavity. The device
(Continued)

layer, which spans the cavity, further comprises a bridge on which a plurality of piezoresistive sensing elements are formed. The present pressure sensor is more immune to temperature effects. It is especially suitable for operating in a high temperature, high pressure environment and is capable of delivering accurate and reliable pressure measurements at low cost.

21 Claims, 12 Drawing Sheets

(51) Int. Cl.
- *B81B 7/00* (2006.01)
- *G01B 7/16* (2006.01)
- *B81B 3/00* (2006.01)
- *B81C 1/00* (2006.01)
- *B81C 3/00* (2006.01)

(52) U.S. Cl.
CPC ........ *B81C 1/0015* (2013.01); *B81C 1/00142* (2013.01); *B81C 1/00158* (2013.01); *B81C 3/001* (2013.01); *G01B 7/16* (2013.01); *G01L 9/0054* (2013.01); *G01L 9/04* (2013.01); *B81B 2201/0264* (2013.01); *B81B 2203/0109* (2013.01); *B81B 2203/0118* (2013.01); *B81C 2203/0109* (2013.01)

(58) Field of Classification Search
CPC .............. B81C 1/00142; B81C 1/0015; B81C 1/00158; B81C 2203/0109; B81C 3/001; G01L 9/0052; G01L 9/0054; G01L 9/04
See application file for complete search history.

(56) References Cited

U.S. PATENT DOCUMENTS

| | | | |
|---|---|---|---|
| 2006/0117871 A1* | 6/2006 | Wilner | G01L 1/2231 73/862.627 |
| 2009/0108382 A1* | 4/2009 | Eriksen | C23C 14/021 257/419 |
| 2010/0005886 A1 | 1/2010 | Aida et al. | |
| 2011/0159627 A1* | 6/2011 | Mantravadi | B81C 1/00182 438/52 |
| 2013/0130502 A1* | 5/2013 | Sparks | H01L 21/302 438/702 |
| 2015/0101413 A1* | 4/2015 | Kwa | G01L 9/0052 73/715 |
| 2015/0192487 A1* | 7/2015 | Belov | B81C 1/00158 73/754 |
| 2015/0276533 A1* | 10/2015 | Belov | G01R 33/07 324/251 |
| 2016/0138990 A1* | 5/2016 | Tanaka | G01L 9/0054 73/727 |
| 2017/0248484 A1* | 8/2017 | Yotsuya | G01L 9/0042 |
| 2018/0245955 A1* | 8/2018 | Arai | B81B 3/00 |

FOREIGN PATENT DOCUMENTS

| | | |
|---|---|---|
| CN | 104062464 A | 9/2014 |
| CN | 105241369 A | 1/2016 |
| CN | 105241600 A | 1/2016 |

OTHER PUBLICATIONS

International Search Report dated Oct. 18, 2016, related to PCT Application No. PCT/CN2016/000369.
English Translation of the International Search Report dated Oct. 18, 2016, related to PCT Application No. PCT/CN2016/000369.
Written Opinion dated Oct. 18, 2016, related to PCT Application No. PCT/CN2016/000369.

* cited by examiner

Step 1

Step 2

Step 3

Step 4

Step 5

Step 6

Figure 12a  Step 7

Step 8

MEMS PRESSURE GAUGE SENSOR AND MANUFACTURING METHOD

CROSS REFERENCE

This application is a U.S. National Phase entry of International Application No. PCT/CN2016/000369 entitled MEMS Pressure Gauge Chip and Manufacturing Method Thereof filed Jul. 8, 2016, with a priority claim to Chinese Patent Application No. 20151506032, filed Aug. 17, 2015.

TECHNICAL FIELD

The present invention is related to a MEMS sensor. In particular, the present invention relates to a MEMS pressure sensor for use in downhole pressure measurements.

BACKGROUND

Downhole pressure measurements are essential when drilling for hydrocarbon recovery. During the drilling process, geological pressure data are collected to tailor drilling parameters and the construction of the well. After the well is drilled and production starts, pressure is continuously monitored for reservoir management. Accurate measurement of pressure is therefore the key to optimize recovery and reduce risk throughout the entire life of a hydrocarbon well. Thus, we need an accurate and cost-effective pressure sensor for downhole measurements.

Pressure sensors usable in hydrocarbon wells must be able to withstand harsh conditions and remain accurate, stable and reliable for weeks during a measurement period. In particular, such sensors must be able to withstand temperature ranging from −50° C. to 250° C. and pressure up to 200 MPa (around 2000 atmospheres) while maintaining an accuracy of better than 0.1%, and desirably 0.01%, of the full-scale pressure.

Two types of pressure sensors are commonly used for downhole applications. The first type is the resonant quartz pressure sensor. In U.S. Pat. No. 3,617,780, one example of resonant quartz pressure sensor is described wherein a crystalline quartz cylinder closed at both ends is immersed in a fluid which communicates with the external pressure to be measured via an isolation diaphragm or a bellow. A crystalline quartz plate spans across the vacuum-sealed cavity inside the cylinder. The plate resonance is excited and detected via the piezoelectric effect. The plate resonant frequency, which varies with the hydrostatic pressure on the cylinder wall, is a measure of the external pressure. Constructed almost entirely out of crystalline quartz and being a mature technology, resonant quartz pressure sensors have achieved the highest benchmark for accuracy, stability and reliability for downhole pressure measurements to date. However, they tend to be very expensive.

The second type of downhole pressure sensors is based on sapphire. In U.S. Pat. No. 5,024,098, a sapphire pressure sensor is described wherein a sapphire cell is immersed in a fluid which communicates with the external pressure to be measured via an isolation diaphragm. The cell deforms under fluid pressure and the resulting strains are measured by strain gauge elements disposed on a planar surface of the sapphire cell. While reliable and rugged for downhole applications, sapphire pressure sensors are in general not as stable and accurate as resonant quartz pressure sensors and they are also quite expensive. In case silicon strain gauge elements are employed, accuracy and stability could be affected by the excessive temperature coefficients of resistance and piezoresistive effect in silicon. On the other hand, if non-silicon strain gauge elements, for example, metallic alloys, are used their low gauge factor and therefore sensitivity can result in the undesirable amplification of temperature and other measurement errors. In any case, mismatch in the thermal expansion coefficients between sapphire and the strain gauge material creates further temperature errors.

The majority of sensors in use today are of the micro-electro-mechanical system (MEMS) type. MEMS based sensors are typically realized with silicon micromachining that originated from integrated circuit fabrication and still shares many of its processing technologies. In addition, there are a few unique processes specifically tailored toward the fabrication of 3-dimensional microstructures. These include double-side photolithography, deep reactive ion etching (DRIE), and wafer bonding to name a few. Silicon has superb mechanical properties not unlike quartz and sapphire, for example, high hardness, high modulus of elasticity, high ultimate strength, and is perfectly elastic up to the fracture point. Moreover, precision microstructures are much easier to fabricate in silicon than in quartz or sapphire. With demonstrated advantages that include low cost, small size, high accuracy, high reliability, and high stability, diaphragm-type silicon MEMS pressure sensors have become the dominant type of pressure sensors in use for automotive, medical, industrial and consumer electronics applications.

Despite their huge success, MEMS pressure sensors have not been widely adopted for downhole applications. There are a few problems that must be overcome. In particular, an improved mechanical design over the conventional diaphragm-type pressure sensors is preferable to handle the very high pressure. Furthermore, there needs to be a better means to deal with the various temperature coefficients and instabilities for overall improved measurement accuracy at high temperature. Accordingly, a need presently exists for an improved MEMS pressure sensor having a high degree of accuracy and reliability for the cost effective measurement of high pressure under high temperature conditions typical of downhole applications.

SUMMARY

The objective of the present invention is to overcome current technological shortcomings so as to provide a cost effective MEMS pressure sensor that is highly accurate and reliable for sensing under the harsh conditions of high temperature and high pressure in a downhole environment.

A pressure sensor comprising:

a chamber and a MEMS pressure sensor die provided within said chamber; said pressure sensor die comprises a handle, a device layer and a cap all connected together;

wherein a silicon oxide layer is formed between said handle and said device layer;

another silicon oxide layer is formed between said device layer and said cap; a handle recess is formed on said handle and a cap recess is formed on said cap; said handle recess and said cap recess are connected to form a cavity;

said device layer, which is provided within said cavity, further comprises a bridge; a plurality of piezoresistive sensing elements are formed on said bridge.

The pressure sensor in the present invention also comprises the following optional features:

Said cavity is a vacuum sealed cavity.

The two ends of said bridge are connected to opposite sides of said cavity.

Said device layer further comprises a cantilever; said piezoresistive sensing element is formed on said cantilever.

Said device layer comprises at least one said bridge and one pair of said cantilevers, said cantilevers are parallel to said bridge; two piezoresistive sensing elements are formed on said bridge and one piezoresistive sensing element is formed on each said cantilever.

Said piezoresistive sensing elements are electrically connected in a Wheatstone bridge configuration.

Said device layer comprises at least two said bridges, said bridges are mutually perpendicular to each other; and two piezoresistive sensing elements are formed on each said bridge.

Said device layer further comprises a cantilever; said piezoresistive sensing element is formed on said cantilever.

Said piezoresistive sensing elements are electrically connected in a Wheatstone bridge configuration.

A silicon oxide insulating layer is formed on the top, the bottom and along the sides of said piezoresistive sensing element.

A metal contact is provided at each of the two terminals of said piezoresistive sensing element.

Said pressure sensor die uses a silicon-on-insulator construction;

said silicon-on-insulator construction comprises a top silicon layer, a bottom silicon layer, and a buried silicon oxide layer; a cavity is formed in said bottom silicon layer;

wherein said handle is formed in said bottom silicon layer, said device layer is formed in said top silicon layer, and said buried silicon oxide layer is formed between said top silicon layer and said bottom silicon layer.

Said device layer is formed on a {100} crystallographic plane of p-type silicon, said piezoresistive sensing element is oriented along a <110> crystallographic direction.

Said device layer is formed on a {100} crystallographic plane of n-type silicon, said piezoresistive sensing element is oriented along a <100> crystallographic direction.

Said device layer is formed on a {110} crystallographic plane of p-type silicon, said piezoresistive sensing element is oriented along a <110> or <111> crystallographic direction.

Said device layer is formed on a {110} crystallographic plane of n-type silicon, said piezoresistive sensing element is oriented along a <100> crystallographic direction.

Said device layer is formed on a {111} crystallographic plane of p-type silicon.

Said chamber is enclosed in a metal housing, said chamber is filled with an electrically insulating fluid, and said pressure sensor die is immersed in said electrically insulating fluid.

A metal diaphragm is further provided; said metal diaphragm seals said electrically insulating fluid and said pressure sensor die in said chamber, wherein external pressure to be measured is transmitted from said metal diaphragm to said pressure sensor die.

A MEMS pressure sensor die fabrication process comprising the following steps:

Step 1, grow or deposit a silicon oxide layer on the top surface and the bottom surface of a silicon-on-insulator wafer which was prefabricated with buried cavities in the bottom silicon layer;

Step 2, using photolithography and ion implantation, form highly conductive regions, which are highly doped, on said top silicon layer;

Step 3, using photolithography and etching, etch trenches through said top silicon layer reaching said buried silicon oxide layer to form said piezoresistive sensing elements;

Step 4, grow or deposit a layer of silicon oxide to fill said trenches;

Step 5, using photolithography and etching, etch contact holes through said silicon oxide layer on top of said highly conductive regions reaching said top silicon layer; using metal deposition, photolithography and etching, form metal interconnection patterns from said contact holes to peripheral bond pads;

Step 6, using photolithography and etching, etch trenches through said top silicon layer and said buried silicon oxide layer punching into said buried cavities in said bottom silicon layer, thus forming said freely suspended bridges and cantilevers;

Step 7, bond a cap silicon wafer which was prefabricated with recesses to said silicon-on-insulator wafer;

Step 8, using wafer dicing, cut the bonded silicon wafer into individual MEMS pressure sensor dice.

The fabrication process for said recesses in said cap silicon wafer comprises photolithography and etching.

Said etching method comprises one kind or a combination of dry and wet etching methods; said dry etching method is selected from one or more of the following methods: deep reactive ion etching, reactive ion etching, or gaseous xenon difluoride etching for silicon; as well as reactive ion etching, plasma etching, or hydrofluoric acid vapor etching for silicon oxide.

Said wet etching method for silicon comprises one kind or a combination of the following etchants: potassium hydroxide, tetramethylammonium hydroxide, or ethylenediamine pyrocatechol.

Said wet etching method for silicon oxide comprises one kind or a combination of the following etchants: hydrofluoric acid or buffered hydrofluoric acid.

Comparing with the quartz and sapphire pressure sensors in the prior art, the manufacturing cost of a silicon MEMS pressure sensor is much lower. However, conventional diaphragm-type silicon MEMS pressure sensors cannot function in a 200 MPa environment. The sensing diaphragm will likely rupture under such high external pressure. On the other hand, if the lateral dimensions and thickness of the diaphragm are respectively reduced and increased to avoid failure, the deformation and stress largely localized on the diaphragm at lower operating pressure are increasingly extended to the bulk of the sensor. Such extension severely degrades the performance and narrows the design window of silicon MEMS pressure sensors. In contrast, the pressure sensor die in the present invention does not utilize a diaphragm element. Instead, the sensor die is allowed to deform freely under the action of the external pressure on all of its faces. The die compression is then converted to longitudinal compression of a bridge element spanning an internal cavity in the sensor die. This longitudinal compression is in turn sensed by piezoresistive sensing elements provided on the bridge. The present invention therefore takes advantage of the bulk compression in the sensor die and does not rely on a diaphragm element as in conventional silicon MEMS pressure sensors. This way the present invention overcomes the main difficulty in the mechanical design of the high pressure MEMS sensor die while retaining the advantages of MEMS pressure sensors.

Secondly, conventional MEMS piezoresistive sensing elements are electrically insulated by reverse biased PN junctions, the leakage current of which increases exponentially with temperature. As the temperature rises above 150° C., the insulation property of the PN junction will fail. On the other hand, in the present invention, a layer of silicon oxide is provided on the top, the bottom and along the sides of the piezoresistive sensing element. As a result, each piezoresistive sensing element is completely wrapped around and fully insulated with a layer of silicon oxide insulation. Using this dielectric isolation scheme, the electrical insulation will operate even at high temperature.

Thirdly, whereas the piezoresistive sensing elements provided on the bridge are used to sense the strain of the sensor die along one longitudinal direction, the piezoresistive sensing elements provided on the cantilevers remain strain free. This is because the cantilever is only supported at one end but otherwise freely suspended inside the die cavity. The cantilever therefore does not undergo a deformation even when the rest of the sensor die deforms under external pressure. Thus, the piezoresistive sensing elements provided on the cantilevers are used for compensation. Specifically, by electrically connecting the sensing elements on the bridge and cantilevers together in a Wheatstone bridge configuration, temperature and other common mode errors are significantly reduced, thereby increasing the accuracy of the present pressure sensor.

Lastly, in a preferred embodiment, the internal cavity inside the sensor die is sealed in vacuum. It is within this sealed cavity that all the sensing elements are located and where they are least susceptible to external interferences, such as local temperature fluctuations, and foreign contaminations, such as dust. The pressure sensor in the present invention is therefore more stable and reliable than conventional MEMS pressure sensors. Furthermore, the entire pressure sensor die uses a silicon construction which avoids the problems caused by the mismatch between dislike materials. It also enables the use of MEMS fabrication technologies which results in much lower manufacturing cost than the quartz and sapphire pressure sensors in the prior art.

BRIEF DESCRIPTION OF THE DRAWINGS

FIGS. 12a and 12b are cross-sectional views illustrating step 7 and step 8 of the fabrication process of the pressure sensor die.

DETAILED DESCRIPTION

The illustrative embodiments of the present invention will be described in detail with reference to the accompanying drawings. Please note that the scope of the present invention is not limited to these precise embodiments described. Various changes or modifications may be effected therein by one skilled in the art without departing from the scope or spirit of the invention.

Figure 1:
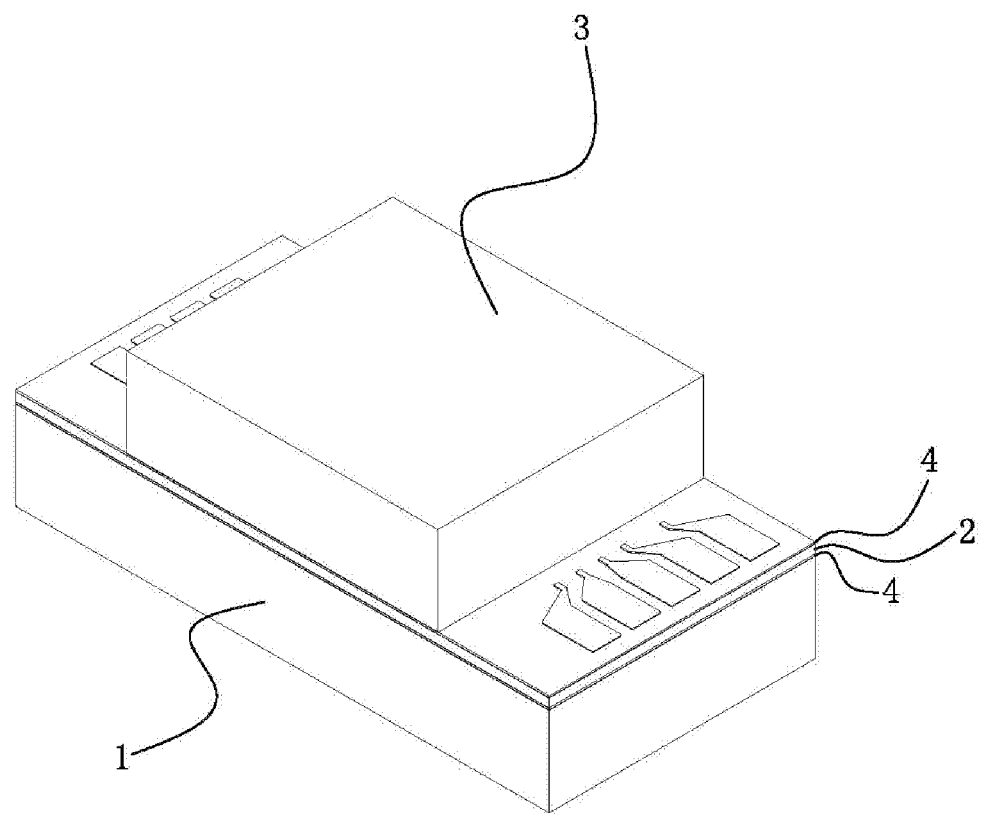
FIG. 1 is a perspective view of the pressure sensor die.
Figure 2:
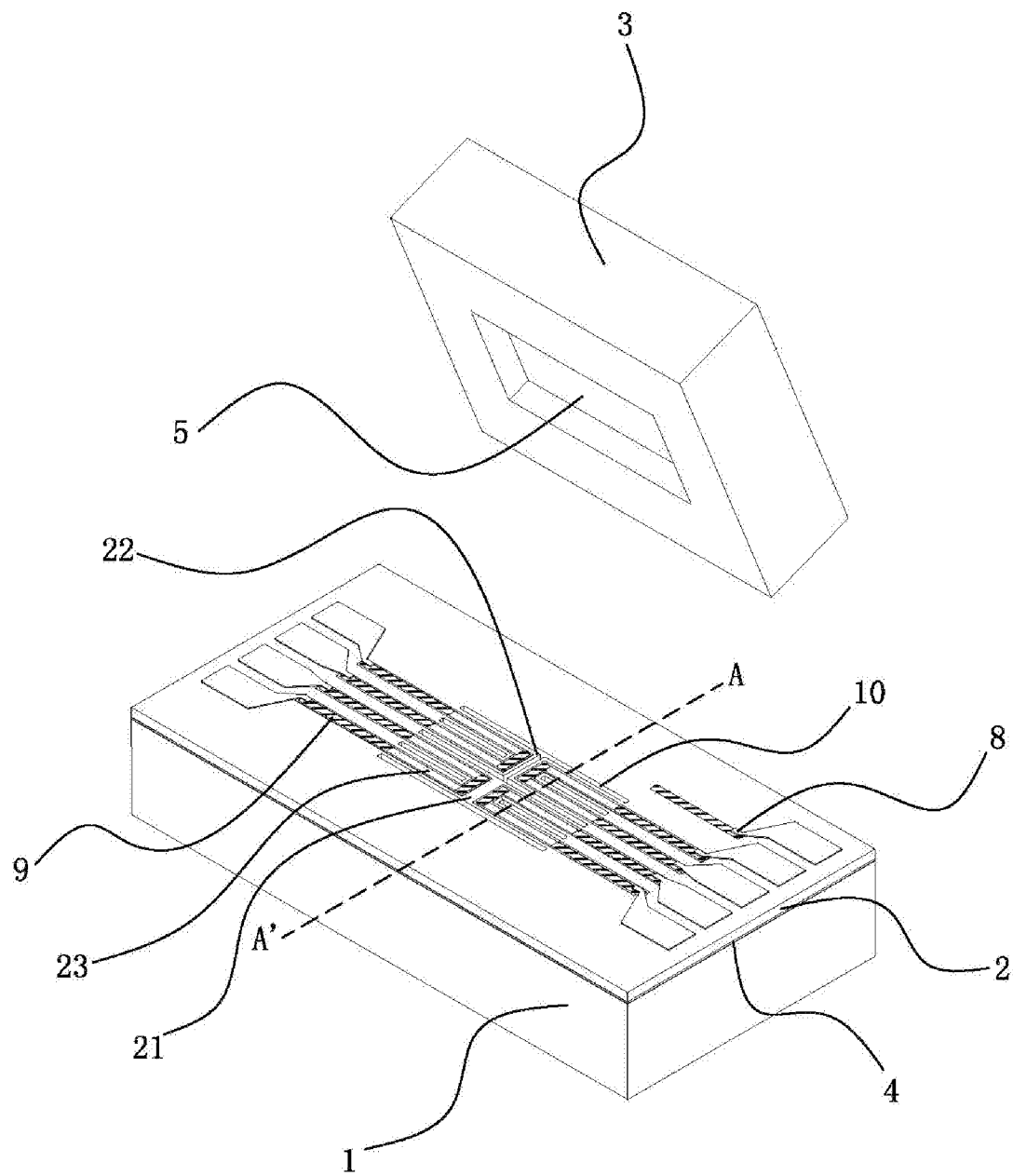
FIG. 2 is a perspective view of the pressure sensor die of FIG. 1 further with the cap flipped open revealing a recess underneath and further with the top silicon oxide layer removed revealing various features on the device layer.
Figure 3:
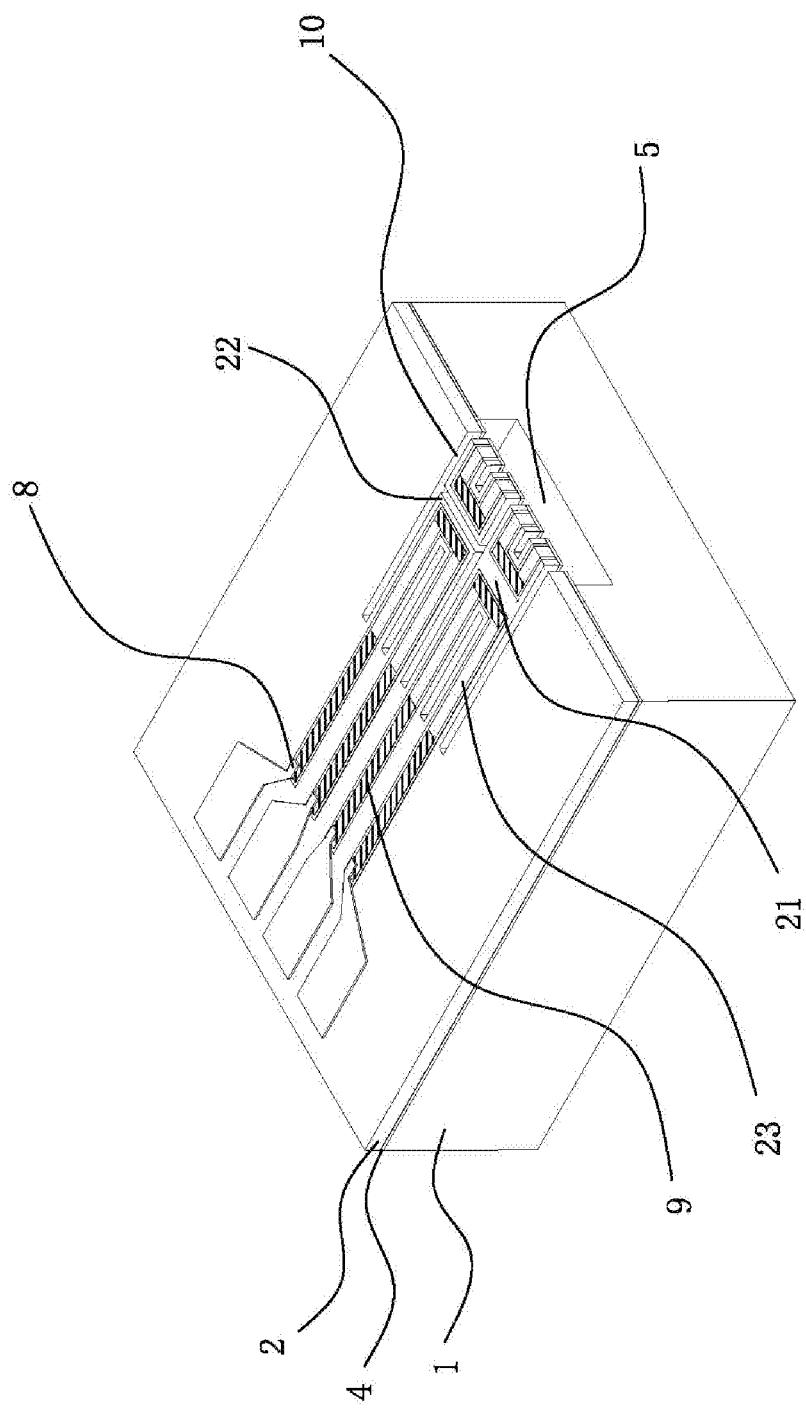
FIG. 3 is a cutaway view of the pressure sensor die of FIG. 2 along line AA'.
Figure 4:
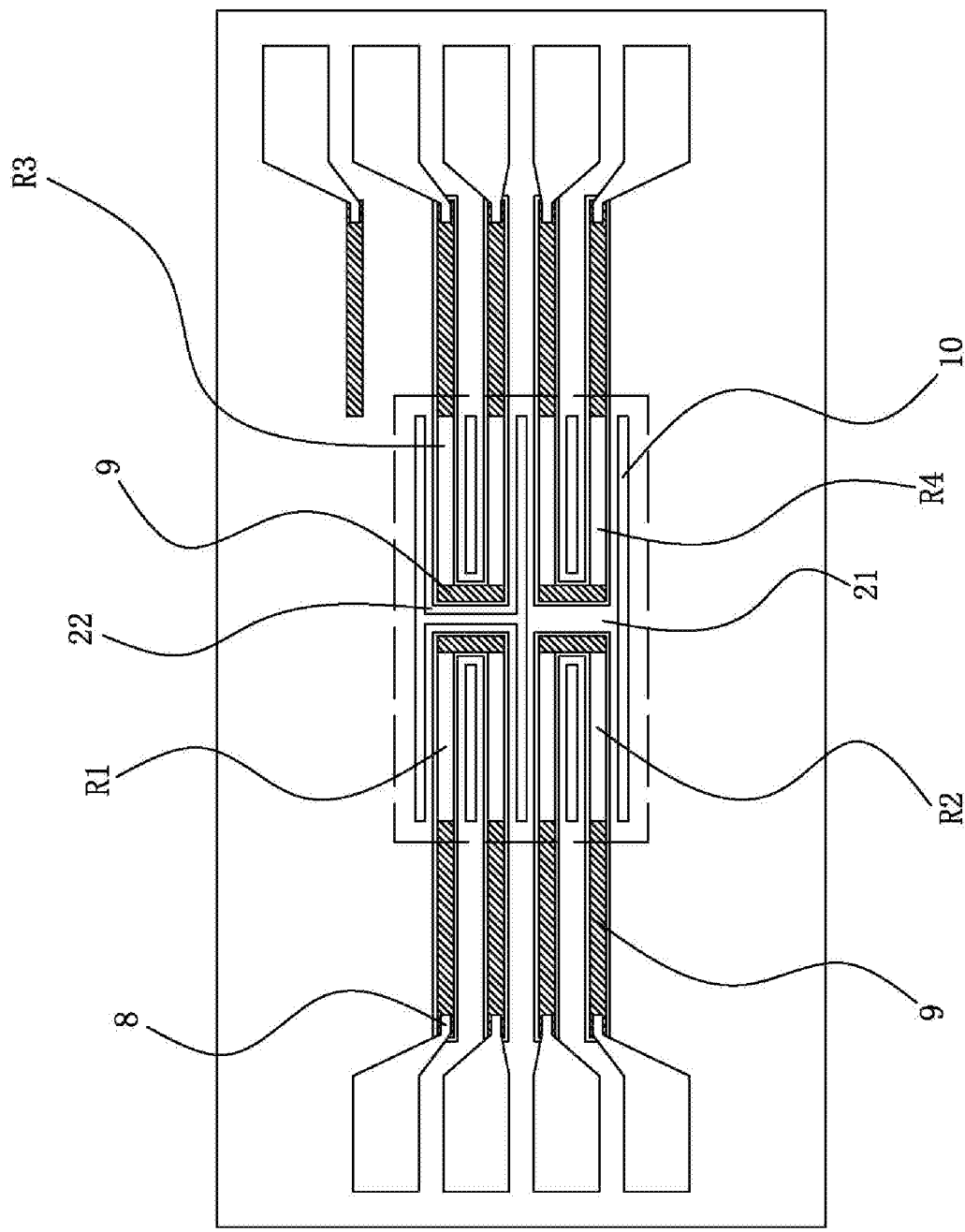
FIG. 4 is a plan view of the device layer in the first embodiment of the pressure sensor die.
Figure 5:
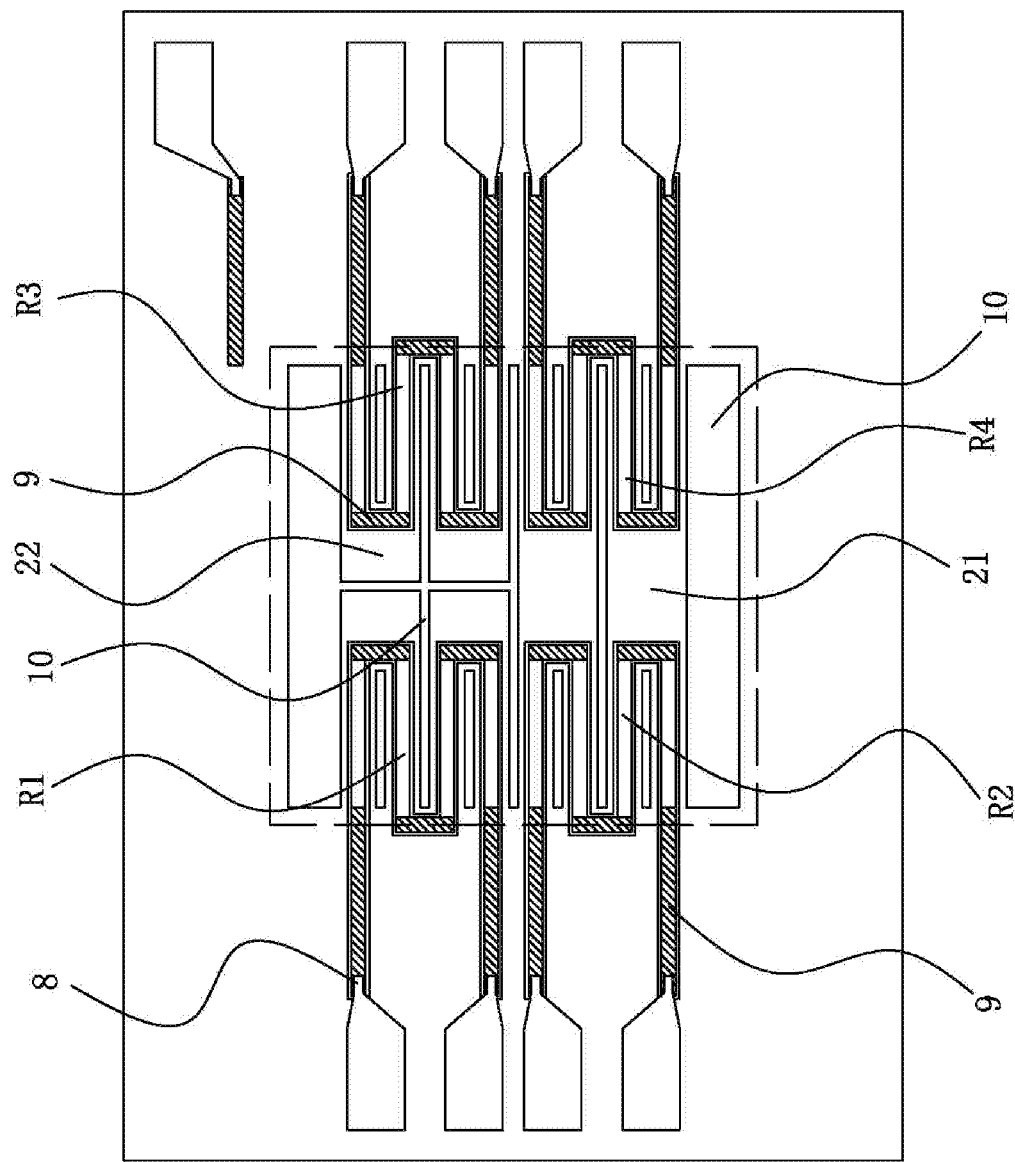
FIG. 5 is a plan view of the device layer with a serpentine piezoresistive sensing element layout in the first embodiment of the pressure sensor die.
Figure 6:
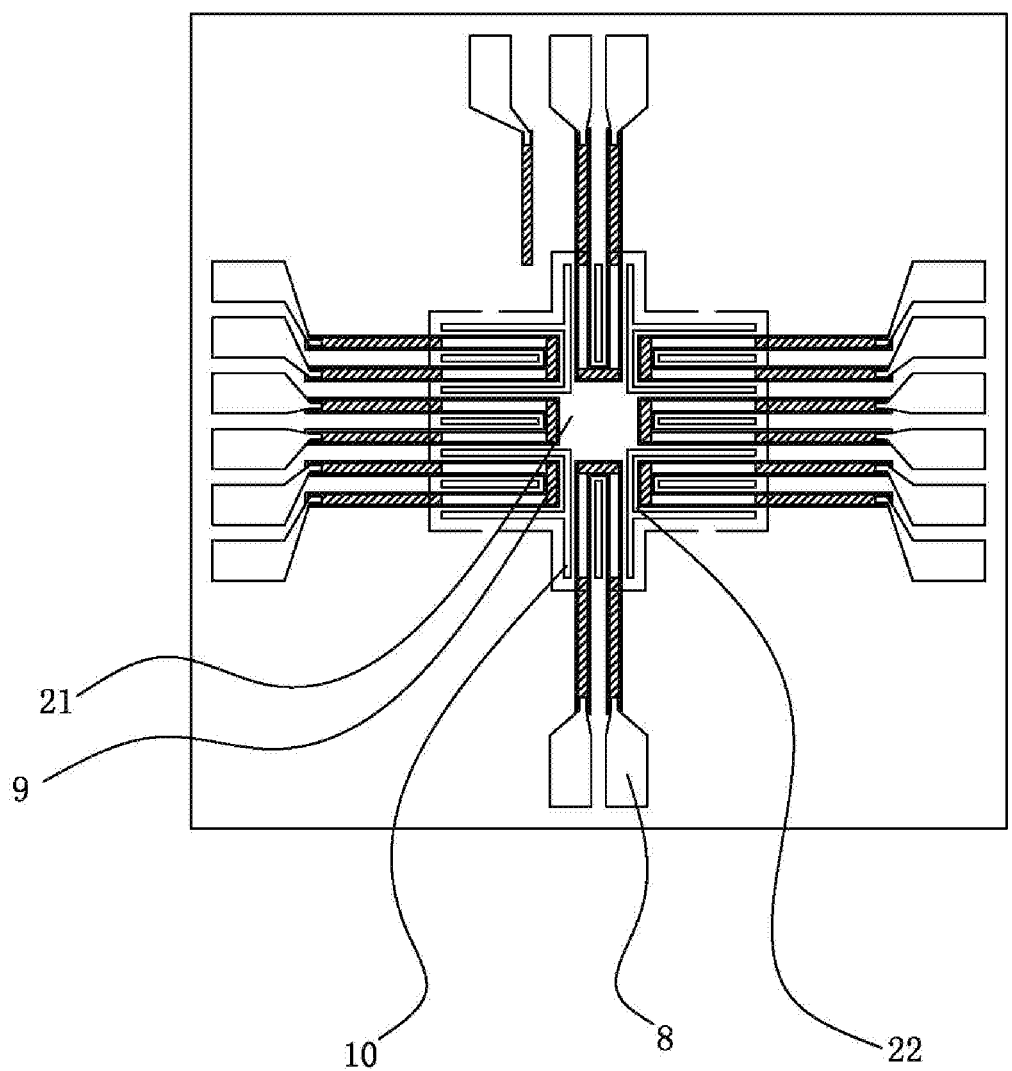
FIG. 6 is a plan view of the device layer in the second embodiment of the pressure sensor die.

With reference to FIGS. 1-3, a pressure sensor die is shown which comprises a handle 1, a device layer 2, and a cap 3. Silicon oxide layers 4 are respectively provided between handle 1 and device layer 2, as well as between device layer 2 and cap 3. Recesses 5 are formed respectively on handle 1 and cap 3 and face each other. Recesses 5 on handle 1 and cap 3 are connected together to form a sealed cavity. The device layer 2 is located within the sealed cavity. In FIGS. 4-6, the boundary of this cavity is illustrated by the dashed lines. Preferably, the MEMS pressure sensor die is manufactured on a silicon-on-insulator (SOI) wafer. The SOI wafer comprises a top silicon layer 6, a bottom silicon layer 7, and a silicon oxide layer 4. Handle 1 is formed in the bottom silicon layer 7 wherein recess 5 is prefabricated in a prior manufacturing step. Device layer 2 is formed in the top silicon layer 6. Silicon oxide layer 4, which is formed between top silicon layer 6 and bottom silicon layer 7 in the SOI wafer, is also referred to as a "buried" silicon oxide layer and serves as the electrical insulation between top silicon layer 6 and bottom silicon layer 7. The MEMS pressure sensor die is thus constructed almost entirely out of silicon, which helps reduce the measurement errors caused by the mismatch in thermal expansion coefficients between different materials. Preferably, the cavity formed by recesses 5 on handle 1 and cap 3 is a vacuum sealed cavity; this further reduces the undesirable effects of local temperature fluctuations and foreign contaminants, such as dust, on piezoresistive sensing elements 23 housed inside the cavity. Metal contacts 8 are provided on top silicon oxide layer 4 located outside cap 3. These metal contacts 8 are respectively connected to the terminals of piezoresistive sensing elements 23 provided on device layer 2. A separate metal contact 8, which connects to ground, is provided on the remaining area of device layer 2 which is not a part of piezoresistive sensing elements 23. External electrical circuits and components are only connected to the metal contacts 8; thus it further reduces electrical cross-talk among piezoresistive sensing elements 23.

FIGS. 1-4 illustrate the first embodiment of the present pressure sensor die. Device layer 2 comprises a bridge 21 and two cantilevers 22 freely suspended in the die cavity. Four piezoresistive sensing elements, R1 to R4, are provided respectively on the bridge 21 and cantilevers 22. With reference to FIG. 4, piezoresistive sensing elements R2 and R4 are provided on bridge 21, and piezoresistive sensing elements R1 and R3 are respectively provided on each cantilever 22. Bridge 21 and the two cantilevers 22 preferably have an identical layout except that the two cantilevers 22 are separated by a trench 10. As a result, the two cantilevers are freely suspended in the die cavity. The four piezoresistive sensing elements R1 to R4 also preferably have an identical layout so that when the pressure sensor die is not under an external pressure, the electrical resistance in R1 to R4 should be basically equal. Also, preferably, silicon oxide layers 4 are formed on the top, the bottom and along the sides of piezoresistive sensing element 23; each piezoresistive sensing element 23 is therefore completely wrapped around with silicon oxide insulator.

With reference to FIGS. 2-4, the four piezoresistive sensing elements, R1 to R4, are U-shaped and identical. Highly conductive regions 9 are formed at the two terminals as well as at the turnaround corners of each piezoresistive sensing element 23. The dopant type of highly conductive regions 9 is the same as the dopant type in device layer 2. For p-type device layer, highly conductive regions 9 are of p+ type, which have a higher p-dopant concentration than that in the lightly p-doped device layer 2. This reduces the resistivity of the silicon material from approximately 0.1 Ω-cm in device layer 2 to approximately 0.01 Ω-cm, thus forming said highly conductive regions 9. The case for n-type device layer is similar except that the highly conductive regions 9 must be of n+ type instead. For each U-shaped piezoresistive sensing element 23, the layout is such that the total electrical resistance, which is the sum of the individual resistances of the lightly doped and highly doped segments, primarily comes from the two longitudinal segments that are lightly doped. In actual pressure measurements, it is these two lightly doped longitudinal segments that produce the largest resistance change. By selectively reducing the resistivity of piezoresistive sensing elements 23 in the highly conductive regions 9, the fractional resistance change and hence overall sensitivity of piezoresistive sensing element 23 is greatly increased. In general, the layout of piezoresisitive sensing element 23 is not limited to one U-shaped segment. FIG. 5 illustrates an example of a serpentine layout for piezoresistive sensing element 23 comprising a few U-shaped segments.

As the pressure sensor die is compressed under the external pressure, cantilevers 22 remain strain free since they are freely suspended in the die cavity. The resistance of piezoresistive sensing elements R1 and R3, which are provided on cantilevers 22, should therefore remain essentially unchanged under the external pressure. On the other hand, bridge 21 is connected to the opposite sides of the die cavity, which therefore directly experiences the die compression. As a result, the bridge longitudinal strain is to first order proportional to the external pressure. The resistance of piezoresistive sensing elements R2 and R4, which are provided on bridge 21, should therefore vary linearly with the bridge longitudinal strain and hence external pressure to first order according to silicon piezoresistance theory. From Ohm's law, V=IR, when the current passing through piezoresistive sensing elements R2 and R4 stays constant but the resistances of R2 and R4 change, the voltages across R2 and R4 will change. Therefore, based on the measured voltage changes across R2 and R4, the magnitude of the external pressure can be calculated accordingly. Besides strains, there are, however, other environmental factors, such as temperature, that may change the resistance values. In the present invention, piezoresistive sensing elements R1 and R3 are primarily used for the compensation of temperature and other common mode errors that affect all four piezoresistive sensing elements R1 to R4 by an equal amount.

Figure 7:
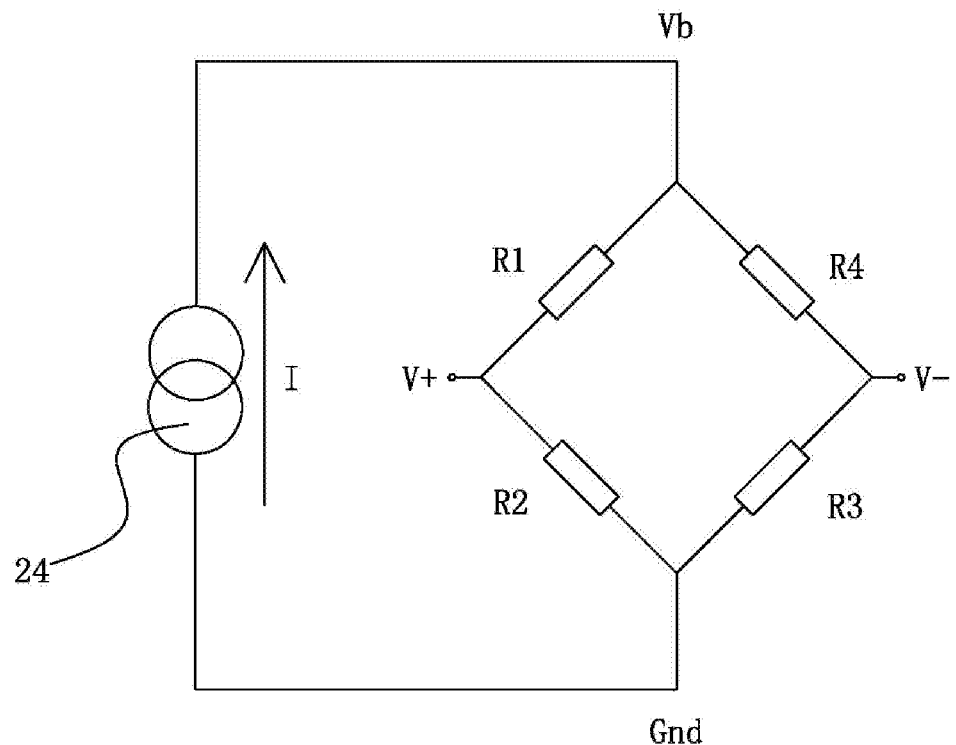
FIG. 7 is a circuit diagram of the piezoresistive sensing elements connected in a Wheatstone bridge configuration.

With reference to FIG. 7, preferably, piezoresistive sensing elements R1 to R4 are electrically connected in a Wheatstone bridge configuration. A constant current source 24 supplies the current going through the Wheatstone bridge. The external pressure can be calculated by measuring the voltage difference between points V+ and V−. When the pressure sensor die is not subjected to external pressure, the piezoresistive sensing elements R1 to R4 are unstrained and their resistances are almost identical; the voltage difference between points V+ and V− is then close to zero. On the other hand, when an external pressure is applied to the pressure sensor die, the die compression and hence strains induced in piezoresistive sensing elements R2 and R4 result in a resistance change, and a voltage difference develops between points V+ and V−. A major advantage of the Wheatstone bridge configuration is the reduction of common-mode errors which in many cases can be comparable in magnitude to the full scale pressure signal. For example, as the temperature changes, the resistances of all four piezoresistive sensing elements change by about the same amount. As a result, when there is no external pressure, the voltage between points V+ and V− remains close to zero, and the Wheatstone bridge stays balanced. In the present invention, the Wheatstone bridge can be powered by a constant voltage source or a constant current source, but a constant current source is preferred because the negative temperature coefficient of silicon piezoresistive effect is partially offset by the positive temperature coefficient of resistance, resulting in an overall reduced scale factor error over temperature. Furthermore, the bridge voltage, represented by Vb which can be measured, contains temperature information which is useful for further temperature error correction.

With reference to FIGS. 1 and 3, the preferable size of the present pressure sensor die is approximately 2.5 mm in length, 1.5 mm in width and 1 mm in thickness. The internal cavity measures approximately 1 mm in length, 0.5 mm in width and 0.4 mm in height, and device layer 2 is approximately 20 μm in thickness. In manufacturing, an 8 inch silicon wafer can contain thousands to over 10,000 gross pressure sensor dice, thus resulting in a significant reduction in die cost. It should be noted that the foregoing dimensions of the preferred embodiment are for illustrative purposes only. The present invention is not limited to this embodiment and all dimensions can be tailored for a particular design.

By using the SOI wafer construction, and further providing the device layer 2 within the vacuum sealed recess cavity formed by recesses 5 in handle 1 and cap 3, and by wrapping each piezoresistive sensing element 23 with silicon oxide insulator, the measurement accuracy and reliability of the present MEMS pressure sensor are significantly increased. The sensor is also capable of measuring pressure up to 200 MPa pressure within at an operating temperature up to 250° C. environment.

FIG. 4 illustrates one embodiment of the present invention. In this embodiment, only one bridge 21 is formed on device layer 2. It therefore senses the pressure sensor die compression along the longitudinal direction of bridge 21 from which the pressure acting on the sensor die can be calculated.

FIG. 6 further illustrates the second embodiment of the present invention. In this embodiment, two mutually perpendicular bridges 21 and four cantilevers 22 are provided. Similar to the first embodiment, the piezoresistive sensing elements 23 provided on cantilevers 22 are used for reducing temperature and other common mode measurement errors, whereas the four piezoresistive sensing elements 23 provided on the two bridges 21 are used to sense the pressure sensor die compression along two mutually perpendicular directions. Since the pressure sensor die is immersed in an electrically insulating fluid, the hydrostatic pressure acting on the pressure sensor die is uniform on all faces. By sensing the die compression along two perpendicular directions, each of which contains the pressure information, and incorporating them in an averaging scheme, the overall accuracy of pressure measurements is further improved in the present invention.

Regarding the silicon piezoresistance effect, the exact magnitude of electrical resistivity change further varies with the dopant type (p or n), doping concentration, and crystallographic orientation since single crystalline silicon is anisotropic, the details for which are described in Y. Kanda, "A Graphical Representation of the Piezoresistance Coefficients in Silicon," IEEE Transactions on Electron Devices, Vol. ED-29, No. 1, pp. 64-70, January 1982. It is desirable to pick a crystallographic orientation along which the silicon piezoresistance effect is at a maximum. For p-type device layer 2, a commonly used orientation is by having the longitudinal resistor segments oriented along a <110> direction and device layer 2 realized on a {100} plane of crystalline silicon. Another possible orientation is by having the longitudinal resistor segments oriented along a <110> or <111> direction while the device layer 2 is on a {110} plane. For n-type device layer 2, the preferred orientation is by having the longitudinal resistor segments oriented along a <100> direction while the device layer 2 is on a {100} or {110} plane. One particular advantage with these orientations is that the shear piezoresistive coefficients are zero, which means that the piezoresistive sensing resistors 23 are insensitive to shear stresses, even if they are present on bridge 21 and cantilevers 22. Other crystallographic orientations of the piezoresistive sensing elements 23 and device layer 2 are also feasible, e.g., by referring to Y. Kanda's description.

Figure 8:
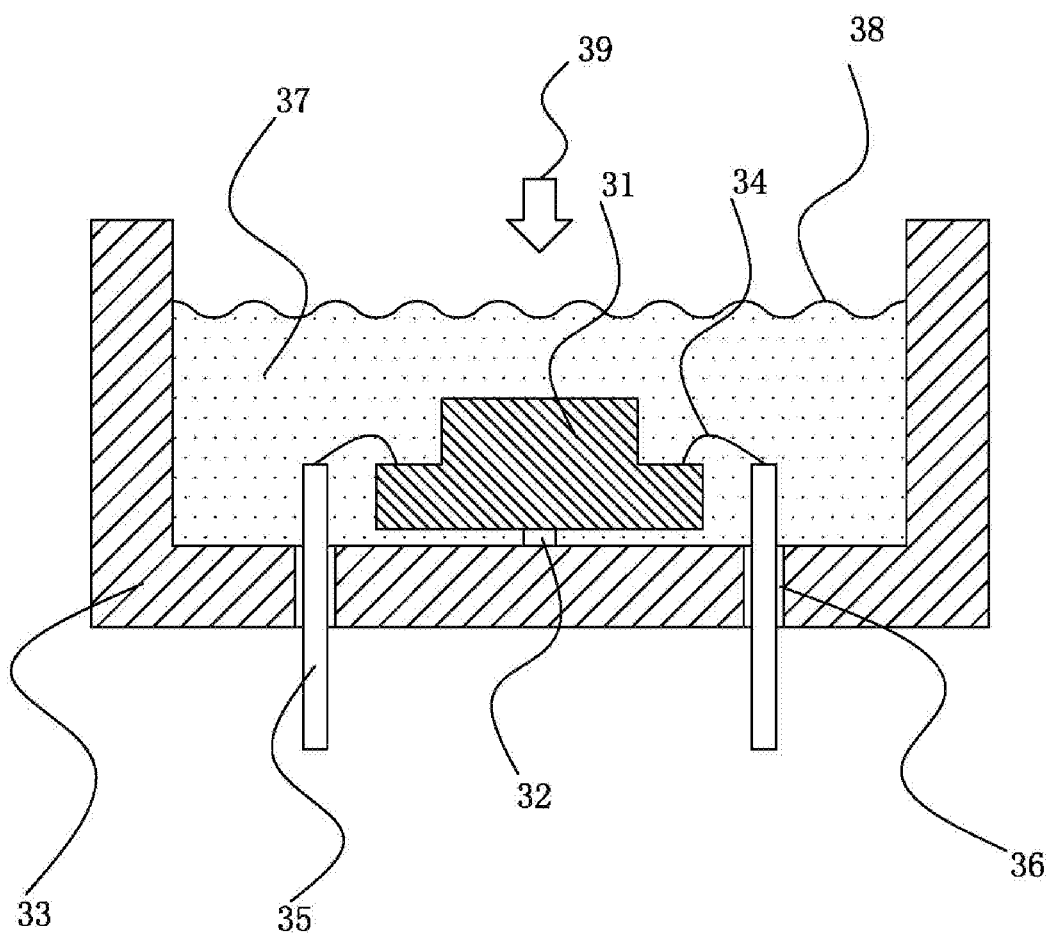
FIG. 8 is a diagrammatic view of the pressure sensor.
Figure 9A:
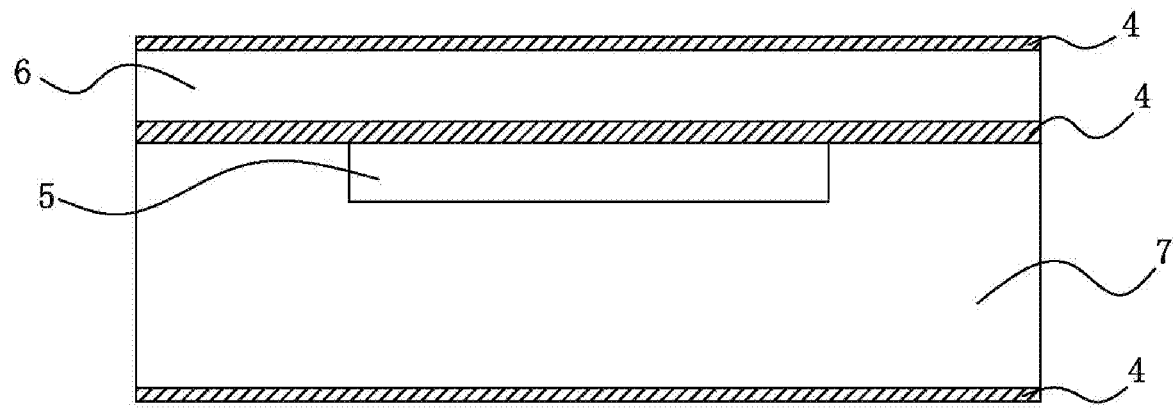
FIGS. 9a and 9b are cross-sectional views illustrating step 1 and step 2 of the fabrication process of the pressure sensor die.
Figure 9B:
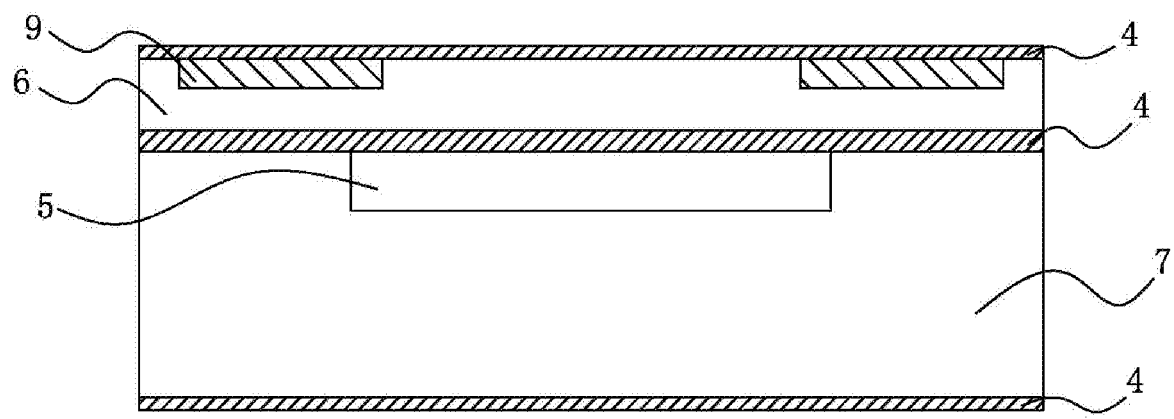
Figure 10A:
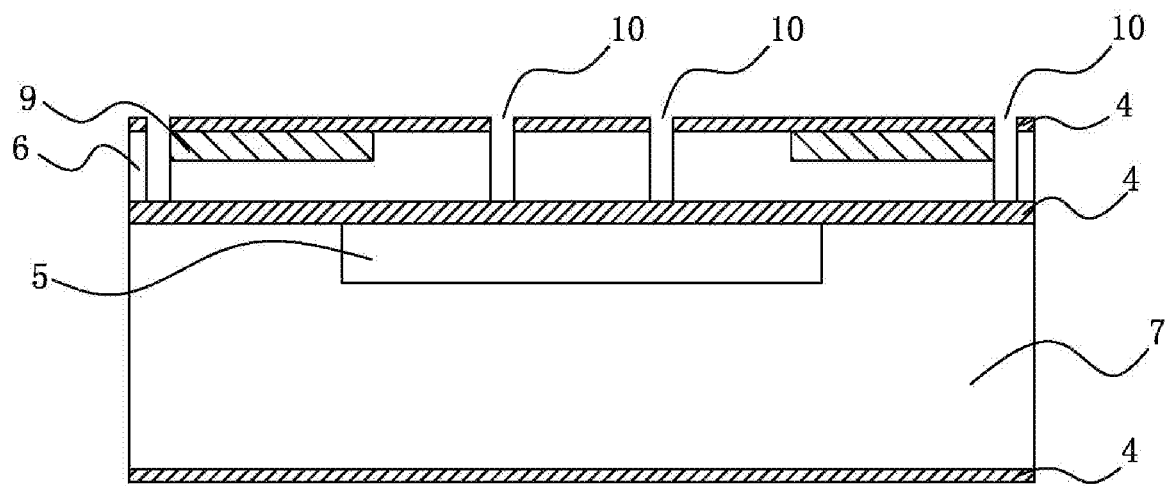
FIGS. 10a and 10b are cross-sectional views illustrating step 3 and step 4 of the fabrication process of the pressure sensor die.
Figure 10B:
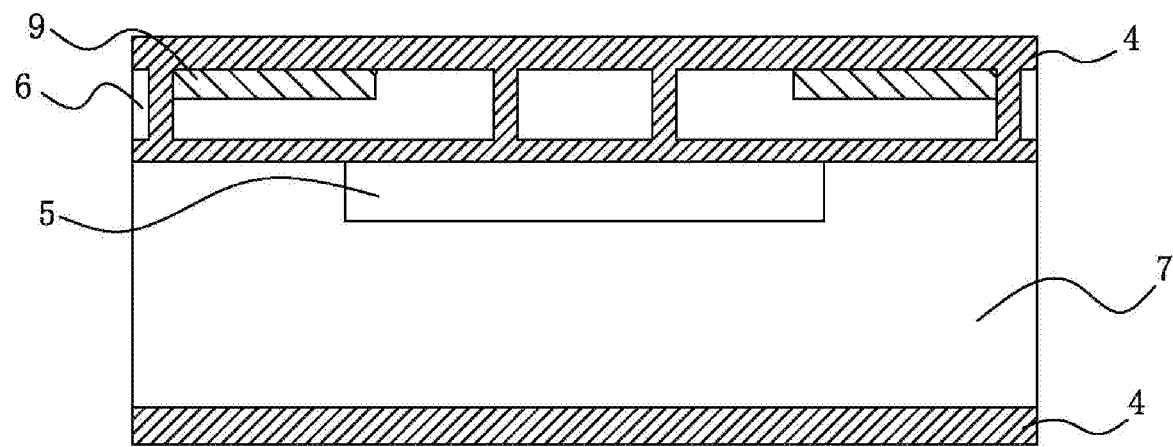
Figure 11A:
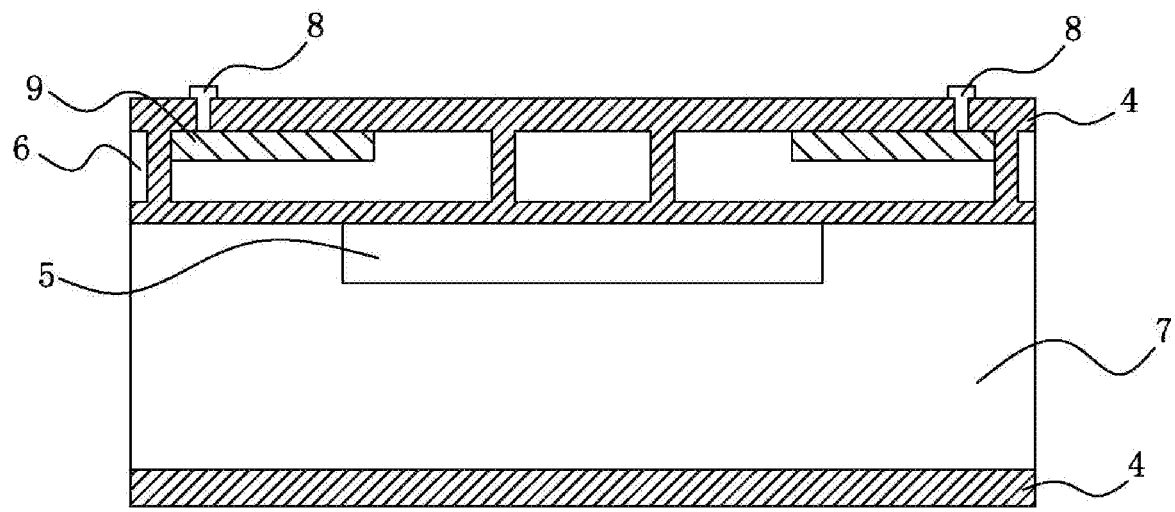
FIGS. 11a and 11b are cross-sectional views illustrating step 5 and step 6 of the fabrication process of the pressure sensor die.
Figure 11B:
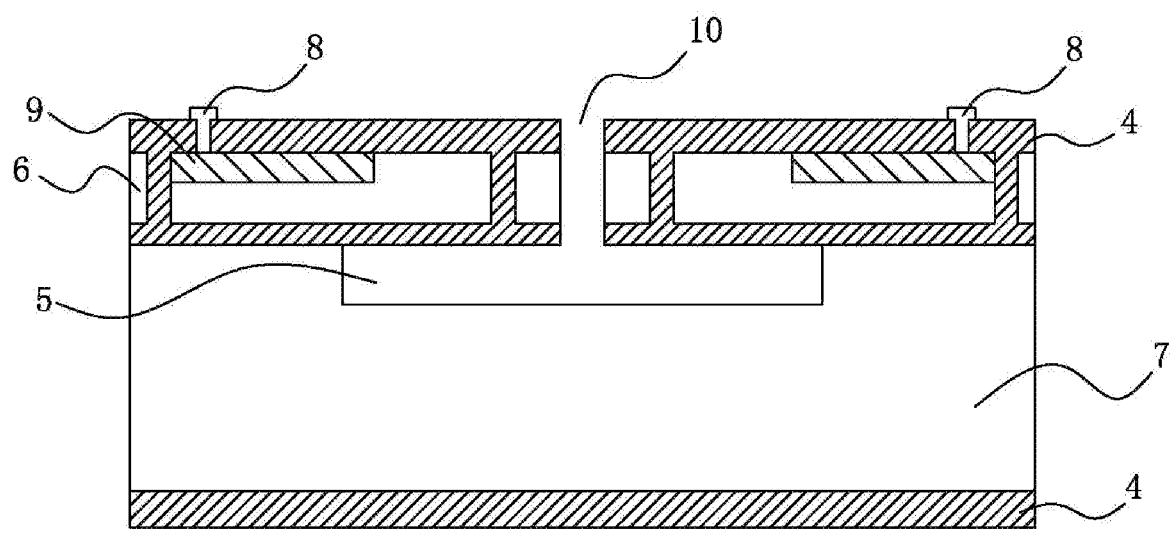
Figure 12B:
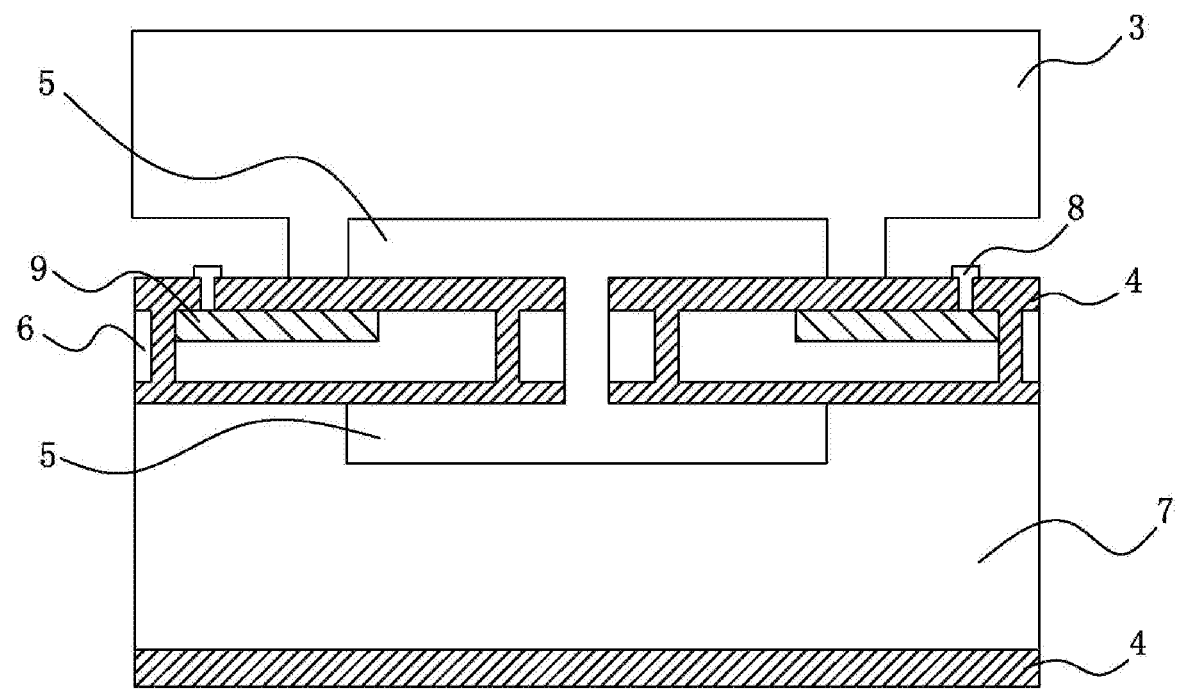
Figure 12B:
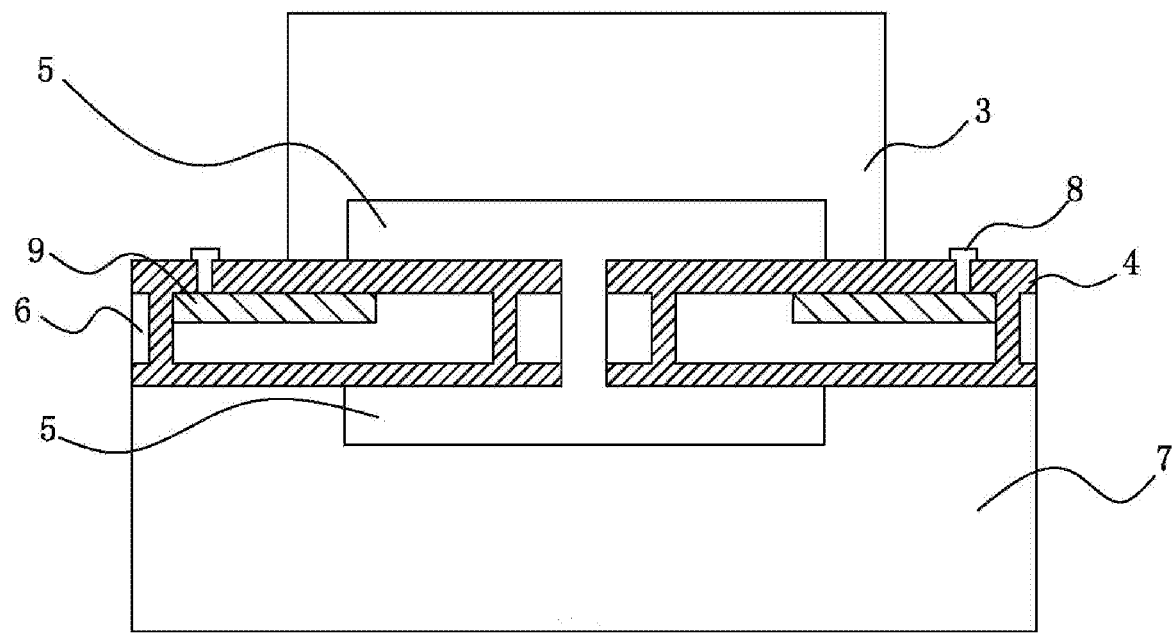

FIG. 8 illustrates a diagrammatic view of the pressure sensor. Pressure sensor die 31 is installed within chamber 33, which is an enclosure defined within a metal housing. Chamber 33 is filled with electrical insulating fluid 37 in which pressure sensor die 31 is immersed. In one embodiment, metal diaphragm 38 is provided to seal both pressure sensor die 31 and electrical insulating fluid 37 within chamber 33. External pressure 39 acting on metal diaphragm 38 is transmitted via electrical insulating fluid 37 to the pressure sensor die 31. Preferably, metal diaphragm 38 is a corrugated baffle with a low stiffness; so almost all of external pressure 39 is transmitted to pressure sensor die 31. Furthermore, the contact between pressure sensor die 31 and the chamber housing is kept to a minimum. For example, pressure sensor die 31 is only attached to the chamber housing through one or several dots or lines of die adhesive 32. Moreover, die adhesive 32 is compliant enough so that under the action of the hydrostatic pressure in electrical insulating fluid 37, pressure sensor die 31 is uniformly compressed and free to deform without hindrance from the chamber housing. Such installation further prevents packaging stresses, which can be caused by the deformation of the chamber housing due to external forces or temperature change, from being transmitted to pressure sensor die 31. In one embodiment, metal bond pads on pressure sensor die 31 are connected via bond wires 34 to metal pillars 35, which are in turn connected to the external electrical circuit. Metal pillars 35 are electrically insulated from one another by insulator 36. Preferably, said cavity within the pressure sensor die 31 is vacuum-sealed, so that the pressure measured by the pressure sensor is absolute pressure referenced to vacuum.

Next, the fabrication technique for the pressure sensor die is described with reference to FIGS. 9 to 12. This fabrication technique can be applied to both structures disclosed in the first and second embodiment. As described above, the pressure sensor die is fabricated on an SOI wafer that comes with an internal cavity formed early in the fabrication process. This cavity-SOI wafer comprises a top silicon layer 6, a buried silicon oxide layer 4, and a bottom silicon layer 7. Recesses 5 are first etched on the bottom silicon wafer which constitutes bottom silicon layer 7, before the bottom silicon wafer is bonded to the top silicon wafer. The bonded top silicon wafer is then thinned down to the desired thickness to form top silicon layer 6 of the cavity-SOI wafer. The pressure sensor die in the present invention therefore employs the aforementioned cavity-SOI wafer as the starting material, followed by additional process steps as described in below.

Step 1 (FIG. 9*a*), form a layer of silicon oxide 4 on the cavity-SOI wafer by means of thermal oxidation or chemical vapor deposition method.

Step 2 (FIG. 9*b*), using photolithography, first coat a layer of photoresist on the cavity-SOI wafer. Then expose the photoresist according to certain mask pattern. The exposed photoresist is then dissolved away with a developer, leaving the unexposed photoresist which is subsequently hard baked. This way the mask pattern is transferred onto the photoresist on the silicon oxide layer 4. Then using ion implantation, the exposed areas on the silicon oxide layer 4 is implanted with a dopant ion with sufficient energy to penetrate the silicon oxide layer 4 reaching the top silicon layer 6. Meanwhile, the ions are stopped by the hard-baked photoresist in the unexposed areas and will not reach the top silicon layer 6. This way, selective areas on top silicon layer 6 are implanted with dopant ions, which subsequently form highly conductive regions 9 in which the electrical resistance is greatly reduced. If the top silicon layer 6 is of p-type, then a p-type dopant, such as boron ion, can be used. If the top silicon layer 6 is of n-type, then an n-type dopant, such as phosphorus ion, can be used. Lastly, the photoresist is removed. In addition to the ion implantation method, the dopant can also be introduced by a high temperature diffusion technique.

Step 3 (FIG. 10*a*), using photolithography, transfer a mask pattern onto a layer of photoresist on the cavity-SOI wafer. Then etch the silicon oxide layer 4 using wet or dry etching to form several trenches 10 reaching down to the top silicon layer 6. Then further etch the trenches 10 from the top silicon layer 6 down to buried silicon oxide layer 4 using deep reactive ion etching or other dry or wet etching methods to form piezoresistive sensing elements 23.

Step 4 (FIG. 10*b*), use thermal oxidation or chemical vapor deposition method to form a silicon oxide layer 4 that fills trenches 10. As a result, the piezoresistive sensing elements 23 are completely wrapped around by a layer of silicon oxide insulation.

Step 5 (FIG. 11*a*), using photolithography, transfer a mask pattern onto a layer of photoresist on the cavity-SOI wafer. Then etch the exposed areas of silicon oxide layer 4 using wet or dry etching, thus forming multiple contact holes 8 reaching down onto the highly doped areas 9 in the top silicon layer 6. Deposit metal on the cavity-SOI wafer and inside contact holes 8. Then use photolithography and metal etching process to form metal interconnection patterns from said contact holes 8 to peripheral bond pads.

Step 6 (FIG. 11*b*), using photolithography, transfer a mask pattern onto a layer of photoresist on the cavity-SOI wafer. Then etch silicon oxide layer 4 by using dry or wet etching to form trenches 10 reaching down to top silicon layer 6. Further etch top silicon layer 6 inside the trenches 10 down to buried silicon oxide layer 4 using deep reactive ion etching or other etching methods. Continue the etch through buried silicon oxide layer 4 in the trenches 10 using dry reactive ion etching or dry plasma etching, thereby punching into the buried cavity in bottom silicon layer 7 and by which forming freely suspended bridge 21 and cantilevers 22. Lastly, remove the photoresist using dry plasma etching.

Step 7 (FIG. 12*a*), bond the cap silicon wafer preprocessed with recess 5 with the processed cavity-SOI wafer in vacuum to form the vacuum sealed cavity. The bonding technique includes silicon fusion bonding, eutectic bonding, solder bonding, and anodic bonding.

Step 8 (FIG. 12b), dice the bonded silicon wafer using, e.g., wafer sawing, into complete MEMS pressure sensor dice.

The etching methods are selected from one or more of the following methods: dry etching or wet etching; the dry etching for silicon comprises deep reactive ion etching, reactive ion etching, and gaseous xenon difluoride etching; and the dry etching for silicon oxide comprises reactive ion etching, plasma etching, and hydrofluoric acid vapor etching.

The wet etching of silicon comprises one kind or a combination of the following etchants: potassium hydroxide, tetramethylammonium hydroxide or ethylenediamine pyrocatechol.

The wet etching of silicon oxide comprises one kind or a combination of the following etchants: hydrofluoric acid or buffered hydrofluoric acid.

In the present invention, the piezoresistive sensing elements are placed inside a vacuum sealed cavity. This reduces the undesirable influence from the external environment and foreign materials, and increases the reliability and accuracy of the pressure sensor. Moreover, each piezoresistive sensing element is completely wrapped around and isolated by a layer of silicon oxide insulator. This reduces crosstalk and interference between sensing elements. Such dielectric isolation scheme also enables the present pressure sensor to operate at high temperature. Furthermore, connecting the piezoresistive sensing elements in a Wheatstone bridge configuration is the key to reduce common-mode errors and temperature effects. Finally, manufacturing the sensor die on an SOI wafer using microfabrication techniques not only solves the material mismatch problem in the thermal expansion coefficients, it also significantly reduces the manufacturing cost of the pressure sensor die. As described above, a single 8-inch SOI wafer can produce thousands to over 10,000 MEMS pressure sensor dice.

Given all these beneficial features, the present pressure sensor is suitable for measuring pressure reaching 200 MPa at temperature reaching 250° C. in a downhole environment.

Lastly, it will be appreciated by those of ordinary skill in the art that many variations in the foregoing preferred embodiments are possible while remaining within the scope of the present invention. The present invention should thus not be considered limited to the preferred embodiments or the specific choices of materials, configurations, dimensions, applications or ranges of parameters employed therein.

The invention claimed is:

1. A pressure sensor comprising:
a chamber;
a MEMS pressure sensor die provided within said chamber, said pressure sensor die including a handle, a device layer and a cap all connected together;
a first silicon oxide layer formed between said handle and said device layer;
a second silicon oxide layer formed between said device layer and said cap;
a handle recess formed on said handle;
a cap recess formed on said cap, said handle recess and said cap recess are connected to form a cavity;
said device layer, which is provided within said cavity, further includes a bridge having a first plurality of piezoresistive sensing elements formed on said bridge, and a cantilever having a second plurality of piezoresistive sensing elements formed on said cantilever, each of said piezoresistive sensing elements having a silicon oxide insulating layer formed on a top, a bottom and along sides thereof.

2. The pressure sensor according to claim 1, wherein said bridge includes two ends that are connected to opposite sides of said cavity.

3. The pressure sensor according to claim 1, wherein said device layer includes at least one said bridge and one pair of said cantilevers, said cantilevers are parallel to said bridge, two piezoresistive sensing elements formed on said bridge, and one piezoresistive sensing element formed on each said cantilever.

4. The pressure sensor according to claim 3, wherein said piezoresistive sensing elements are electrically connected in a Wheatstone bridge configuration.

5. The pressure sensor according to claim 1, wherein said device layer includes at least two said bridges mutually perpendicular to each other, with two piezoresistive sensing elements formed on each said bridge.

6. The pressure sensor according to claim 5, wherein said piezoresistive sensing elements are electrically connected in a Wheatstone bridge configuration.

7. The pressure sensor according to claim 1, wherein metal contacts are provided at end point terminals of said piezoresistive sensing element.

8. The pressure sensor according to claim 1, wherein said pressure sensor die uses a silicon-on-insulator construction;
said silicon-on-insulator construction includes a top silicon layer, a bottom silicon layer, and a buried silicon oxide layer, with a cavity formed in said bottom silicon layer;
wherein said handle is formed in said bottom silicon layer, said device layer is formed in said top silicon layer, and said buried silicon oxide layer is formed between said top silicon layer and said bottom silicon layer.

9. The pressure sensor according to claim 8, wherein said device layer is formed on a {100} crystallographic plane of p-type silicon, said piezoresistive sensing element is oriented along a <110> crystallographic direction.

10. The pressure sensor according to claim 8, wherein said device layer is formed on a {100} crystallographic plane of n-type silicon, said piezoresistive sensing element is oriented along a <100> crystallographic direction.

11. The pressure sensor according to claim 8, wherein said device layer is formed on a 11101 crystallographic plane of p-type silicon, said piezoresistive sensing element is oriented along a <110> or <111> crystallographic direction.

12. The pressure sensor according to claim 8, wherein said device layer is formed on a 11101 crystallographic plane of n-type silicon, said piezoresistive sensing element is oriented along a <100> crystallographic direction.

13. The pressure sensor according to claim 8, wherein said device layer is formed on a 11111 crystallographic plane of p-type silicon.

14. The pressure sensor according to claim 1, wherein said chamber is an enclosure within a metal housing, said chamber is filled with an electrically insulating fluid, and said pressure sensor die is immersed in said electrically insulating fluid.

15. The pressure sensor according to claim 14, further comprising a metal diaphragm that seals said electrically insulating fluid and said pressure sensor die in said chamber.

16. The pressure sensor according to claim 15, wherein external pressure to be measured is transmitted from said metal diaphragm to said pressure sensor die.

17. A MEMS pressure sensor die fabrication process comprising the following sequential steps:

grow or deposit a silicon oxide layer on a top surface and a bottom surface of a silicon-on-insulator wafer which was prefabricated with buried cavities in a bottom silicon layer;

using photolithography and ion implantation, form highly conductive regions, which are highly doped, on said top silicon layer;

using photolithography and etching, etch trenches through said top silicon layer reaching said buried silicon oxide layer to form piezoresistive sensing elements;

grow or deposit a layer of silicon oxide to fill said trenches;

using photolithography and etching, etch contact holes through said silicon oxide layer on top of said highly conductive regions reaching said top silicon layer;

using metal deposition, photolithography and etching, form metal interconnection patterns from said contact holes to peripheral bond pads;

using photolithography and etching, etch trenches through said top silicon layer and said buried silicon oxide layer punching into said buried cavities in said bottom silicon layer, thus forming said freely suspended bridges and cantilevers;

bond a cap silicon wafer which was prefabricated with recesses to said silicon-on-insulator wafer; and using wafer dicing, cut the bonded silicon wafer into individual MEMS pressure sensor dice.

18. The MEMS pressure sensor die fabrication process according to claim 17, wherein the fabrication process for said recesses in said cap silicon wafer includes photolithography and etching.

19. The MEMS pressure sensor die fabrication process according to claim 17, wherein said etching method includes one kind or a combination of dry and wet etching methods, said dry etching method is selected from one or more of the following methods: deep reactive ion etching, reactive ion etching, or gaseous xenon difluoride etching for silicon; or reactive ion etching, plasma etching, or hydrofluoric acid vapor etching for silicon oxide.

20. The MEMS pressure sensor die fabrication process according to claim 17, wherein said wet etching method for silicon includes one kind or a combination of the following etchants: potassium hydroxide, tetramethylammonium hydroxide, or ethylenediamine pyrocatechol.

21. The MEMS pressure sensor die fabrication process according to claim 17, wherein said wet etching method for silicon oxide includes one kind or a combination of the following etchants: hydrofluoric acid or buffered hydrofluoric acid.

* * * * *